United States Patent [19]

Oscilowski et al.

[11] Patent Number: 4,943,844
[45] Date of Patent: Jul. 24, 1990

[54] HIGH-DENSITY PACKAGE

[75] Inventors: Alex A. Oscilowski, Charles E. Williams, Gary L. Beene and Peter Zogas, Austin, Tex.

[73] Assignee: Texas Instruments Incorporated, Dallas, Tex.

[21] Appl. No.: 801,029

[22] Filed: Nov. 22, 1985

[51] Int. Cl.$^5$ .................. H01L 23/04; H01L 23/36; H01L 23/12

[52] U.S. Cl. ........................ 357/74; 357/75; 357/81

[58] Field of Search ............... 357/75, 74, 81

[56] References Cited

U.S. PATENT DOCUMENTS 4,541,003 9/1985 Otsuka et al. ................. 357/74

FOREIGN PATENT DOCUMENTS 0061046 5/1980 Japan .
0031046 2/1984 Japan .
0044851 3/1984 Japan .
0010764 1/1985 Japan .
0117763 6/1985 Japan .
1139345 1/1969 United Kingdom .

OTHER PUBLICATIONS

"Directly Attached IC Circuit Lead Frame"–DeBoskey IBM Technical Disclsure Bullentin–vol. 15, No. 10, June 1972, p. 307.

"Cooling and Minimizing Temperature Gradient in Stacked Modules"–Audi–IBM Technical Disclosure Bulletin–vol. 19, No. 2–Jul. 1976, p. 414.

Primary Examiner—Rolf Hille
Assistant Examiner—S. V. Clark
Attorney, Agent, or Firm—René E. Grossman; Melvin Sharp

[57] ABSTRACT

A chip carrier with improved packing density, wherein at least one layer of chips is bonded not directly to the substrate, but rather to a heat plate which attaches over the chip cavity and inside the hermetic sealing lid. The heat plate has openings in it to permit attachment of the leads from the chips in the upper layer to bond pads on a bonding ledge inside the cavity of the chip carrier, after the heat plate is emplaced. Each bonding ledge is preferably made somwhat wider than it would otherwise be, and the leads from multiple layers of chips are preferably bonded onto the same bonding ledge.

36 Claims, 2 Drawing Sheets

HIGH-DENSITY PACKAGE

BACKGROUND AND SUMMARY OF THE INVENTION

The present invention relates to chip carriers.

In conventional leadless chip-carriers, multiple layers of a ceramic (which usually is mostly alumina) are fired together to produce a structure having a cavity in which an integrated circuit chip can be mounted. The chip is connected to bond pads on a shelf inside the cavity, and a lid (e.g. of molybdenum or Kovar) is soldered on to make a hermetic seal on the cavity. Some of the ceramic layers which make up the chip carrier have metal traces patterned on them before firing, to make connections between the bond pads inside the hermetically sealed cavity and contacts on the outside of the chip carrier. Thus, the chip carrier can be mounted on a circuit board by making contact to its external contacts, while the chip remains hermetically isolated.

This technology is fairly mature and reliable, but some of its limitations must now be overcome. For example, at present there is a tremendous thrust towards finding ways to include multiple chips in a chip carrier. While it is possible to put more than one chip in the chip cavity and bond them out using conventional technology, this straightforward approach runs into several problems. One problem is footprint: putting four chips into a carrier should ideally require much less board area than four separate carriers would; but this advantage will not be fully obtained with prior art technology. Another problem is interconnect: the interconnect topologies permitted by the prior art chip carriers tend to be fairly simple, but optimal design of multi-chip modules would be greatly facilitated by more complex interconnect.

One way to achieve higher density per unit board area in multi-chip chip carriers would be to find some way to stack more than one layer of chips inside the carrier, but some way to make thermal and electrical connection to the upper layer of chips is necessary. Chips generate heat during operation, and in conventional technology much of this heat flows from the chips through the chip carrier's bottom surface (on which the chips are mounted) down through the circuit board, but this thermal path will not be available for all chips if more than one layer of chips is used. Thus, the problem of thermal dissipation is a major barrier to multi-chip packaging.

The present invention permits higher density in multi-chip carriers, by providing a chip carrier with improved packing density, wherein at least one layer of chips is bonded not directly to the substrate, but rather to a heat plate which attaches over the chip cavity and inside the hermetic sealing lid. The heat plate has openings in it to permit attachment of the leads from the chips in the upper layer to bond pads on a bonding ledge inside the cavity of the chip carrier, after the heat plate is emplaced. Each bonding ledge is preferably made somewhat wider than it would otherwise be, and the leads from multiple layers of chips are preferably bonded onto the same bonding ledge.

Thus, the present invention provides a multi-chip chip carrier where chips can be mounted in more than one layer, and the upper layer or layers of chips have good thermal connection to the circuit board.

The present invention also provides a multi-chip chip carrier with a very compact footprint.

The present invention also provides a new routing for interconnect between the chips and the external contact pads of a chip carrier, which permits interconnect topologies which would not otherwise be possible.

Another recent pressure on chip-carrier interconnect technology arises from the increasing use of processors having huge pinout numbers. For example, some kinds of symbolic processors or signal processors may require pinouts much greater than 100. This puts tremendous pressure on the interconnect capabilities of the conventional package. It may often be particularly advantageous to package such a high-pinout processor in close proximity to one or more other chips (cache memory, bus manager, coprocessor, etc.), but for such structures the conventional technology is totally inadequate. However, the present invention permits such configurations to be usefully exploited.

According to the present invention there is provided:
A chip carrier comprising:
a chip carrier body having a cavity therein, and a lower mounting space, on the bottom of said cavity, for mounting at least one integrated circuit chip;
at least one bonding ledge having contact pads thereon in proximity to said mounting space inside said cavity;
a heat plate mounted above said lower mounting space within said cavity,
said heat plate being attached with low thermal resistance to said body of said chip carrier, said heat plate having a second mounting surface thereon for mounting at least one integrated circuit chip thereon;
at least one integrated circuit mounted on said lower mounting space, and at least one integrated circuit mounted on said second mounting surface;
a plurality of connecting leads linking contact pads on said integrated circuits to selected contact pads on said bonding ledges; and
a lid hermetically sealed to said body of said chip cavity, said lid and said chip cavity enclosing therebetween said lower mounting space, said heat plate, and said chips mounted thereon.

BRIEF DESCRIPTION OF THE DRAWINGS

The present invention will be described with reference to the accompanying drawings, wherein.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

Figure 1:
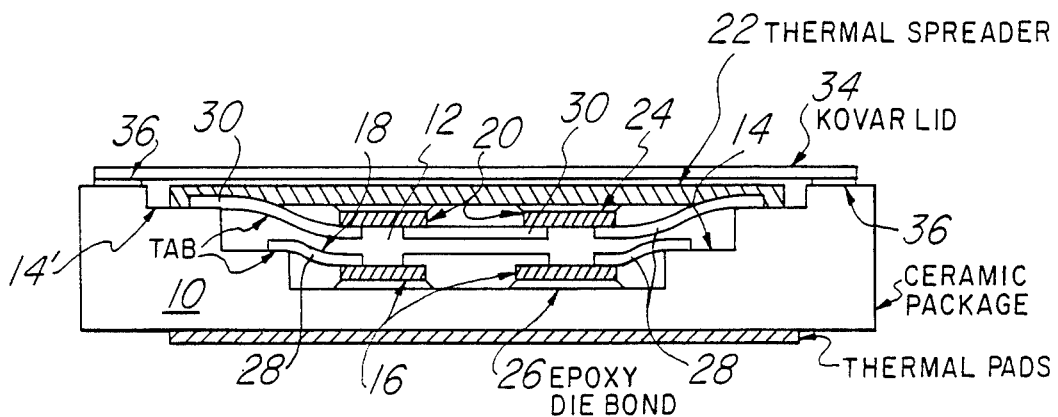
FIG. 1 shows a section of a sample embodiment of the invention, wherein a chip carrier has one layer of chips mounted on the bottom of its cavity and another layer mounted on the underside of a heat plate.

FIG. 1 shows a sample embodiment of the invention. A carrier 10 (made, e.g., of multiple layers of a ceramic such as alumina fused together, or of other package materials if desired) includes a chip cavity 12 bordered by at least one bonding ledge 14. A first set of chips 16 each make thermal contact to the bottom of the chip cavity 12, and have contacts 18 for signal and power leads on their upper surfaces. A second plurality of chips 20 is mounted to a metal heat plate 22. The chips 20 mounted on heat plate 22 are preferably attached to it by thermal epoxy or some comparable compound. Solder may be used for this joint 24 instead, but that is less preferable.

The lower layer of chips 16 is attached to the carrier 10 by a joint 26 which also may be solder or thermal epoxy. However, note that it may be particularly advantageous to make the joint 26 of solder, and the joint 24 of thermal epoxy, since the chips 16 will in general be better heat sinked than the chips 20, and it may be desirable to locate the chips having higher thermal dissipation on the lower level.

Preferably a first TAB strip 28 interconnects the contacts 18 on the tops of the chips 16 to leads at the edge of the TAB strip. Preferably a second TAB strip 30 interconnects the signal and power contacts on the underside of the top layer of chips 20 to a second set of leads at the edge of the TAB strip. Both TAB strips are brought out and the traces on the TAB strips are bonded to the package leads on the bonding ledge 14. This connection may be made by thermocompression bonding or by solder reflow, or by other methods. Note that, if thermocompression is used for bonding, the leads from the two TAB strips may be bonded into the same space on the bonding ledge 14. Alternatively, as shown in FIG. 1, the upper TAB strip 30 may be bonded at locations farther away from the chip cavity 12 than the traces from the lower TAB strip 28.

Figure 2:
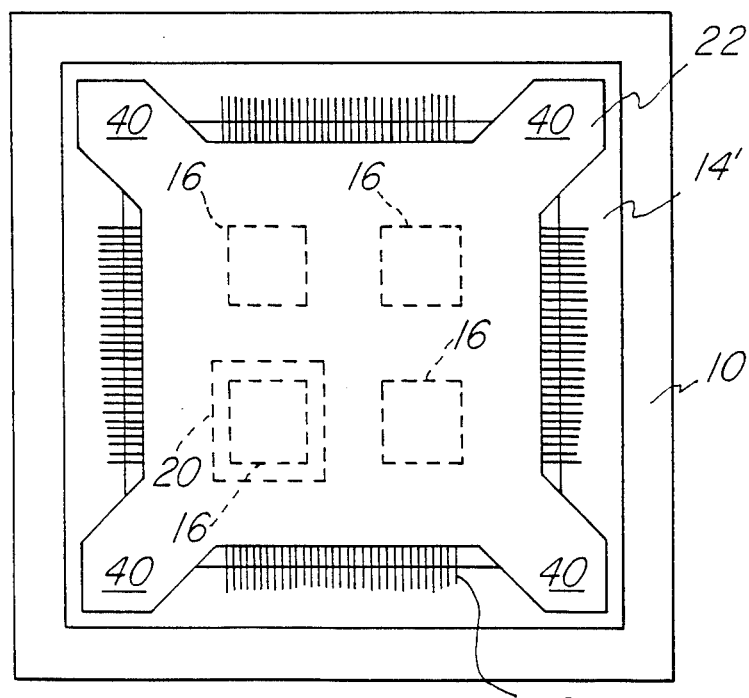
FIG. 2 shows a plan view of the sample embodiment of FIG. 1.

The metal heat plate 22 has openings in it, as will be seen in FIG. 2. Thus, to hermetically seal the package, a top hermetic seal plate (lid) 34 is preferably used, which is bonded to the chip carrier 10 at locations 36 all around the periphery of the cavity 12.

Note that, in the embodiment shown in FIG. 1, the heat plate 22 is epoxy-bonded to lid 34; this optional modification of the invention provides a second heat flow path from the heat plate 22, since heat can now also flow through the lid 34 (where, for example, small finned heat exchangers may be mounted).

The heat plate 22 may be made of molybdenum or Kovar, or of any other material having high thermal conductivity which provides a good thermal expansion match to the carrier 10 (and, ideally, also the chips 20). Note that the heat plate 22 does not strictly have to be made of a metal, but could alternatively be made of silicon or silicon carbide or a composite of the two, or of other materials. The hermetic seal plate 34 is preferably made of Kovar, but could alternatively be made of any other material suitable for a hermetic sealing plate.

FIG. 2 shows a plan view of the sample embodiment of FIG. 1. The outlines of some of the chips in bottom chip layer 16 are shown, but the outlines of the chips in the upper chip layer 20 are not all separately shown; the chips 20 could be laid out in a pattern similar to the chips 16, or in a different pattern, as desired. The TAB strip 30 has its leads brought out and bonded to traces on an upper bonding ledge 14 prime, as previously discussed.

Only two chips 16 are shown, but it should be recognized that the present invention provides capability for a multi-chip package, which can be used for a wide range of numbers of chips. For example, the chip carrier 10 could be made with a chip cavity 12 as small as 0.4 inches wide, or as wide as 2 inches wide, or even wider, depending on the number and size of chips desired to be included. Note that this package may be particularly advantageous as a memory module, wherein a large number of memory chips are included. However, a number of other chip configuration for a multi-chip package may be very advantageous. For example, it may be advantageous to use CMOS high speed processing chips for the second layer of chips 20, and to use cache memory chips 16 for the first layer of chips. In this fashion, one or more processors cna be extremely closely coupled to cache memory.

The heat plate 22 is preferably bonded to the chip carrier 10 at bonding locations 40. To permit adequate room for leads, these locations 40 are preferably located at the corners of the bonding ledge 14, although this is not strictly necessary. The connections 40 can be made of thermal epoxy, or low-temperature solder. This will provide some heat sinking of the chips 20 through metal plate 22 and connections 40. However, the heat sinking of the chips 20 will still typically not be as good as the heat sinking of the chips 16, so that, where this is a design option, it may be preferable to use the chips having lower power dissipation as the upper layer of chips 20, together with higher-power-dissipation chips 16 in the lower part of the package. For example, memory modules including CMOS dRAM chips 20 could integrate 18 1Megabit CMOS dRAM chips 20 with chips 16 for controlling the refresh cycle of the dRAM chips, for parity checking, and for local cache, to provide a 2 Megabyte memory module two inches on a side.

Note that the leads should preferably be low-impedance leads. Another way of regarding the advantages of the present invention is that, for the same number of chips in a package of the same external dimensions (or for a package of a given total heat dissipation capacity), the traces coming out of the package may be made wider. As is generally recognized in the art, it is highly desirable to have low-impedance traces, since, for small lead wires, the inductance of the wires will present a very substantial impedance when clock rates of tens or hundreds of megahertz are desired to be used. That is, an advantage of the present invention is that wider traces can be used than would otherwise be possible for a given package size or for a given total thermal conductance, and therefore the leads used are lower impedance and the problem of lead inductance at high frequency is reduced.

The bonding of the chips 20 to the TAB strip 30 are preferably made by the thermocompression bonding, as are the bondings of the chips 16 to the TAB strip 28.

Instead of using a TAB strip to connect the chips to the ledge 14, discrete bond wires could optionally be used, using a thermocompression bonder or other prior art methods; as discussed, the elimination of organic materials from the interior of the chip cavity may, in some applications, justify the additional cost of discrete-wire bonding.

The spacing of the traces on the TAB strip can be as small as five mil leads on ten mil centers, but ten mil leads on 25 mil centers are more preferable, to reduce impedance and reduce crosstalk.

It should also be recognized that more than one bond ledge 14 can be used, although this is not preferable. With TAB strip interconnects, it is alternatively possible to have a separate ledge for the TAB strip 30 above the ledge for the TAB strip 28.

It is also possible to have more than one layer of heat plate 22. That is, if multiple ledges 14 are used, a second heat plate 22, carrying an additional layer of chips 20, can bond to the upper ledge 14, so that the package would include two (or more) layers of chips 20, each layer having its own heat plate 22, together with a bottom layer of chips 16. Again, this may be desirable for close integration of a microprocessor with large quantities of memory. The fact that microprocessor access to memory never has to go outside of the package means that fast access times can be achieved for this local memory module.

Figure 3:
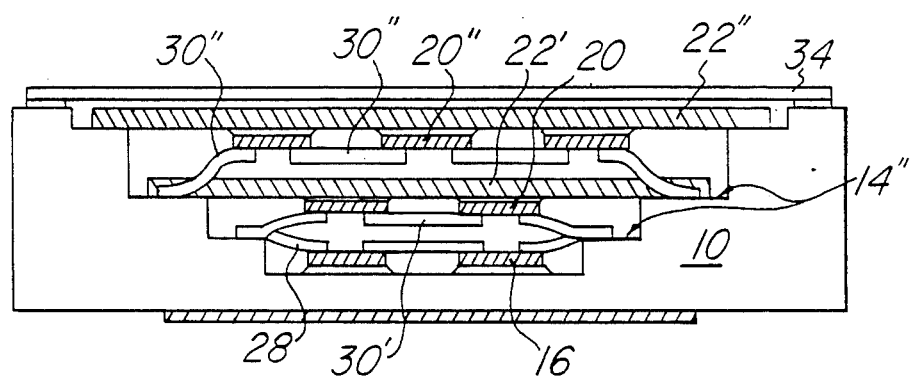
FIG. 3 shows a plan view of a sample embodiment having more than one layer of heat plate.

FIG. 3 shows an example of such a structure, wherein two heat plates 22' and 22" are used. Heat plate 22' supports chips 20', which are connected by strips 30' to a bonding ledge 14", and heat plate 22" supports chips 20", which are connected by strips 30" to a bonding ledge 14"', (which also provides mechanical support for heat plate 22').

As will be appreciated by those skilled in the art, the present invention can be widely modified and varied, and its scope is not limited except as specified in the allowed claims.

What is claimed is:

1. A chip carrier comprising:
   a chip carrier body having a cavity therein, and a lower mounting space, on the bottom of said cavity, for mounting at least one integrated circuit chip;
   at least one bonding ledge having contact pads thereon in proximity to said mounting space inside said cavity;
   at least one heat plate mounted above said lower mounting space within said cavity;
   said heat plate being attached with low thermal resistance to said body of said chip carrier, said heat plate having a second mounting surface thereon for mounting at least one integrated circuit chip thereon;
   at least one integrated circuit chip mounted on said lower mounting space, and at least one integrated circuit chip mounted on said second mounting surface;
   a plurality of connecting leads linking contact pads on said integrated circuits to selected contact pads on said bonding ledges; and
   a lid hermetically sealed to said body of said chip cavity, said lid and said chip cavity enclosing therebetween said lower mounting space, said heat plate, and said chips mounted to said space and said heat plate;
   wherein said heat plate comprises openings to expose plural ones of said contact pads on said bonding ledges.

2. The chip carrier of claim 1, wherein said heat plate has openings therein to expose all of said contact pads and at least one of said bonding ledges.

3. The chip carrier of claim 1, wherein said leads from said chips mounted on said heat plate comprise conductive traces supported at least partially by a polymer strip which extends across multiple anse of said conductive traces.

4. The chip carrier of claim 1, wherein said chip carrier body comprises a multilayer cofired ceramic body.

5. The chip carrier of claim 1,
   wherein a first and second heat plate are enclosed in said cavity,
      said second heat plate lying above said first heat plate,
   and wherein said chip carrier body includes at least first and second bonding ledges,
      said second bonding ledge being higher than said first bonding ledge.
   and said second heat plate being attached with low thermal resistance to said second bonding ledge.

6. The chip carrier of claim 1, wherein said heat plate comprises a metal which has a thermal coefficient of expansion within 20% of that of alumina.

7. The chip carrier of claim 1, wherein said second mounting surface on said heat plate is substantially planar.

8. The chip carrier of claim 1,
   wherein said second mounting surface on said heat plate includes more than one substantially planar portion, said respective planar portions having different heights,
   whereby said chips mounted on said heat plate are not all of the same height.

9. The chip carrier of claim 8,
   wherein said chips mounted on the most protrusive portions of said mounting surface of said heat plate are connected to a first set of parallel leads supported in a flexible polymer strip,
   and at least some of said chips which are not mounted on said most protruding portion of said heat plate are connected to leads supported by a second flexible polymer strip,
   wherein said first polymer strip at least partially overlies said second polymer strip.

10. The chip carrier of claim 1, wherein the average heat dissipation of the chips mounted on said first mounting surface is higher than the average heat dissipation of the chips mounted on said second mounting surface.

11. The chip carrier of claim 1, wherein the total heat dissipation of all of the chips mounted on said first mounting surface of said chip carrier body is more than twice the total heat dissipation of all of the chips mounted on said second mounting surface on said heat plate.

12. The chip carrier of claim 1,
   wherein said chips mounted on said heat plate are connected to said contact pads on said bonding ledges by discrete bonding wires,
   and wherein said second mounting surface on said heat plate faces away from said first mounting surface on said chip carrier body.

13. The chip carrier of claim 1,
   wherein said chips mounted on said heat plate are connected to said contact pads on said bonding ledges through leads supported on a flexible polymer strip,
   and wherein said chips are mounted on the face of said heat plate which faces toward said first mounting surface.

14. The chip carrier of claim 1, wherein a low thermal resistance theremal contact makes a low resistance thermal contact between said heat plate and said lid.

15. The chip carrier of claim 15, wherein said thermal contact comprises a very soft metal.

16. A circuit board assembly comprising:
a board substrate;
a plurality of chip carrier packages affixed to said substrate; and
a plurality of traces interconnecting said chip carrier packages to configure a desired macroscopic circuit configuration;
wherein at least some of said chip carriers comprise:
(a) a chip carrier body having a cavity therein, and a lower mounting space on the bottom of said cavity, for mounting at least one integrated circuit chip;
(b) at least one bonding ledge having contact pads thereon in proximity to said mounting space inside said cavity;
(c) at least one heat plate mounted above said lower mounting space within said cavity;
(d) said heat plate being attached with low thermal resistance to said body of said chip carrier, said heat plate having a second mounting surface thereon for mounting at least one integrated circuit chip thereon said heat plate comprising openings which expose plural ones of said contact pads on said bonding ledges;
(e) at least one integrated circuit chip mounted on said lower mounting space, and at least one integrated circuit chip mounted on said second mounting surface;
(f) a plurality of connecting leads linking contact pads on said integrated circuits to selected contact pads on said bonding ledges; and
(g) a lid hermetically sealed to said body of said chip cavity, said lid and said chip cavity enclosing therebetween said lower mounting space, said heat plate, and said chips mounted to said space and said heat plate.

17. The chip carrier of claim 1, wherein said heat plate is attached to said bonding ledge, and said contact pads on said bonding ledge are positioned within said openings of said heat plate.

18. The chip carrier of claim 1, wherein said openings in heat plate are indentations around the periphery of said heat plate.

19. The chip carrier of 17, wherein said openings in heat plate are indentations around the periphery of said heat plate.

20. The board assembly of claim 16, wherein said heat plate has openings therein to expose all of said contact pads and at least one of said bonding ledges.

21. The board assembly of claim 16, wherein said leads from said chips mounted on said heat plate comprise conductive traces supported at least partially by a polymer strip which extends across multiple ones of said conductive traces.

22. The board assembly of claim 16, wherein said chip carrier body comprises a multilayer co-fired ceramic body.

23. The board assembly of claim 16,
wherein a first and second heat plate are enclosed in said cavity, said second heat plate lying above said first heat plate,
and wherein said chip carrier body includes at least first and second bonding ledges,
said second bonding ledge being higher than said first bonding ledge,
and said second heat plate is attached with low thermal resistance to said second bonding ledge.

24. The board assembly of claim 16, wherein said heat plate comprises a metal which has a thermal coefficient of expansion within 20% of that of alumina.

25. The board assembly of claim 16, wherein said second mounting surface on said heat plate is substantially planar.

26. The board assembly of claim 16,
wherein said second mounting surface on said heat plate includes more than one substantially planar portion, said respective planar portions having different heights,
whereby said chips mounted on said heat plate are not all of the same height.

27. The board assembly of claim 26,
wherein said chips mounted on the most protrusive portions of said mounting surface of said heat plate are connected to a first set of parallel leads supported in a flexible polymer strip,
and at least some of said chips which are not mounted on said most protruding portion of said heat plate are connected to leads supported by a second flexible polymer strip,
wherein said first polymer strip at least partially overlies said second polymer strip.

28. The board assembly of claim 16, wherein the average heat dissipation of the chips mounted on said first mounting surface is higher than the average heat dissipation of the chips mounted on said second mounting surface.

29. The board assembly of claim 16, wherein the total heat dissipation of all of the chips mounted on said first mounting surface of said chip carrier body is more than twice the total heat dissipation of all of the chips mounted on said second mounting surface on said heat plate.

30. The board assembly of claim 16,
wherein said chips mounted on said heat plate are connected to said contact pads on said bonding ledges by discrete bonding wires,
and wherein said second mounting surface on said heat plate faces away from said first mounting surface on said chip carrier body.

31. The board assembly of claim 16,
wherein said chips mounted on said heat plate are connected to said contact pads on said bonding ledges through leads supported on a flexible polymer strip,
and wherein said chips are mounted on the face of said heat plate which faces toward said first mounting surface.

32. The board assembly of claim 16, wherein a low thermal resistance thermal contact material makes thermal contact between said heat plate and said lid.

33. The board assembly of claim 32, wherein said thermal contact material comprises a very soft metal.

34. The board assembly of claim 16, wherein said heat plate is attached to said bonding ledge, and said contact pads on said bonding ledge are positioned within said openings of said heat plate.

35. The board assembly of claim 16, wherein said openings in heat plate are indentations around the periphery of said heat plate.

36. The board assembly of claim 34, wherein said openings in heat plate are in dentations around the periphery of said heat plate.

* * * * *